United States Patent
Vaez-Iravani et al.

(10) Patent No.: US 11,309,163 B2
(45) Date of Patent: Apr. 19, 2022

(54) MULTIBEAMLET CHARGED PARTICLE DEVICE AND METHOD

(71) Applicant: Applied Materials, Inc., Santa Clara, CA (US)

(72) Inventors: Mehdi Vaez-Iravani, Los Gatos, CA (US); Christopher Dennis Bencher, Cupertino, CA (US); Krishna Sreerambhatla, Eindhoven (NL); Hussein Fawaz, Versoix (CH); Lior Engel, Sunnyvale, CA (US); Robert Perlmutter, La Jolla, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/676,717

(22) Filed: Nov. 7, 2019

(65) Prior Publication Data
US 2021/0142976 A1    May 13, 2021

(51) Int. Cl.
| H01J 37/317 | (2006.01) |
| H01J 37/147 | (2006.01) |
| H01J 37/04 | (2006.01) |
| G03F 7/20 | (2006.01) |
| H01J 37/09 | (2006.01) |

(Continued)

(52) U.S. Cl.
CPC ........ *H01J 37/3177* (2013.01); *G03F 7/2059* (2013.01); *G03F 7/70016* (2013.01); *H01J 37/045* (2013.01); *H01J 37/09* (2013.01); *H01J 37/1474* (2013.01); *H01J 37/20* (2013.01); *H01J 37/21* (2013.01); *H01L 21/0277* (2013.01); *H01J 2237/0453* (2013.01);

(Continued)

(58) Field of Classification Search
CPC ........................ H01J 37/3177; G03F 7/2059
See application file for complete search history.

(56) References Cited

U.S. PATENT DOCUMENTS

| 4,163,155 A * | 7/1979 | Alles ...................... B82Y 10/00 |
| | | 250/492.3 |
| 2013/0056647 A1 | 3/2013 | Yoshikawa et al. |
| 2016/0071696 A1* | 3/2016 | Kuiper ................ H01J 37/3177 |
| | | 250/396 R |

FOREIGN PATENT DOCUMENTS

| EP | 2187427 A2 | 5/2010 |
| EP | 2433294 A1 | 3/2012 |

(Continued)

OTHER PUBLICATIONS

Partial European Search Report for European Application No. 20201793.5 A11 dated Mar. 30, A82021.

(Continued)

*Primary Examiner* — Eliza W Osenbaugh-Stewart
(74) *Attorney, Agent, or Firm* — Patterson + Sheridan, LLP

(57) ABSTRACT

A method of method of operating a multibeamlet charged particle device is disclosed. In the method, a target attached to a stage is translated, and each step of selecting beamlets, initializing beamlets, and exposing the target is repeated. The step of selecting beamlets includes passing a reconfigurable plurality of selected beamlets through the blanking circuit. The step of initializing beamlets includes pointing each of the selected beamlets in an initial direction. The step of exposing the target includes scanning each of the selected beamlets from the initial direction to a final direction, and irradiating a plurality of regions of the target on the stage with the selected beamlets.

18 Claims, 6 Drawing Sheets

(51) Int. Cl.
  *H01J 37/20* (2006.01)
  *H01J 37/21* (2006.01)
  *H01L 21/027* (2006.01)
  *H01L 21/768* (2006.01)
(52) U.S. Cl.
  CPC ........... *H01J 2237/20221* (2013.01); *H01J 2237/20285* (2013.01); *H01L 21/76802* (2013.01)

(56) References Cited

FOREIGN PATENT DOCUMENTS

| TW | 200500817 A | 1/2005 |
|---|---|---|
| WO | 2018008916 A2 | 1/2018 |

OTHER PUBLICATIONS

Extended European Search Report for European Application No. 20201793.5 dated Jul. 1, 2021.
Office Action for Taiwan Application No. 109137358 dated Nov. 8, 2021.
Search Report for Taiwan Application No. 109137358 dated Nov. 8, 2021.

* cited by examiner

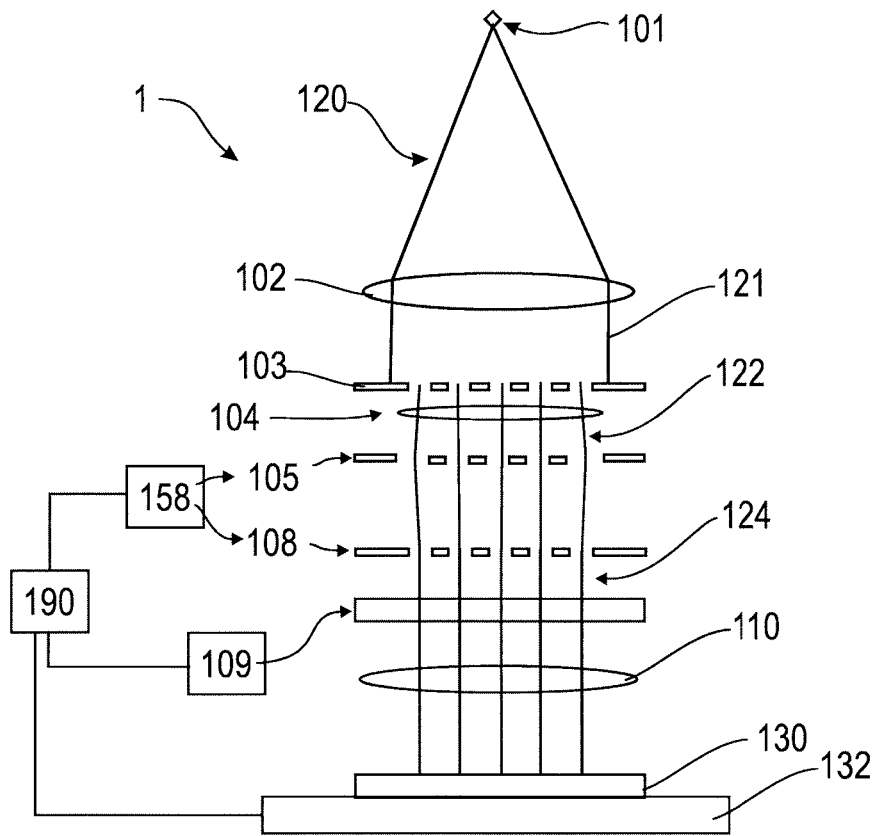
Fig. 1
Fig. 2
Fig. 3

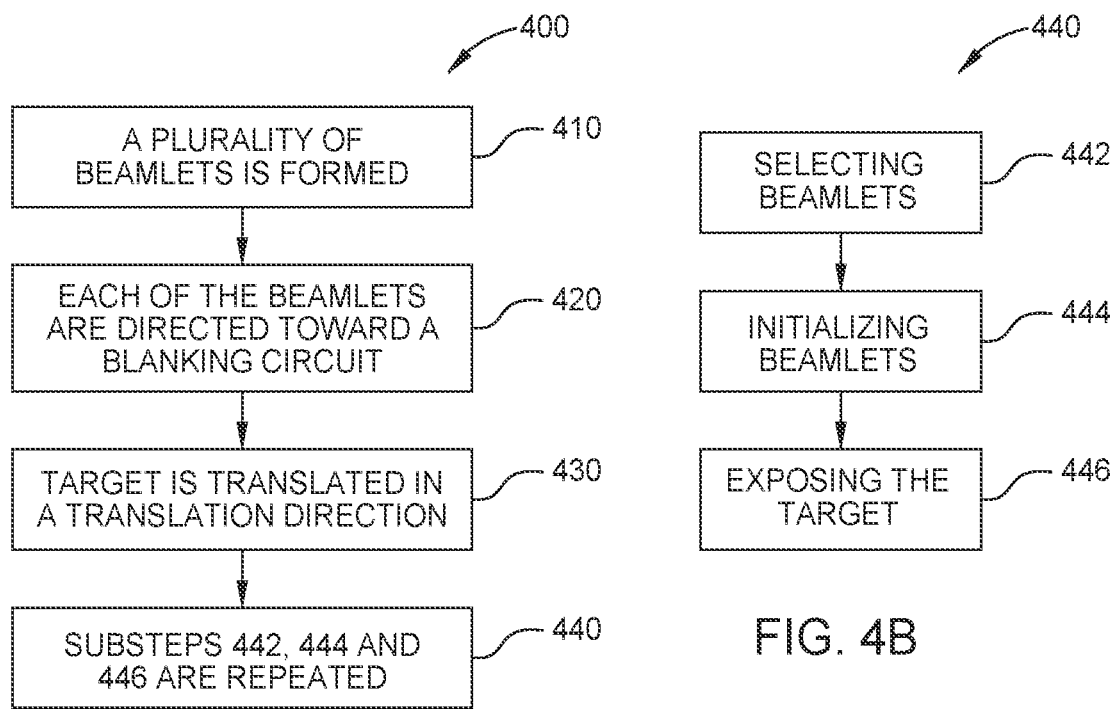
FIG. 4A
FIG. 4B
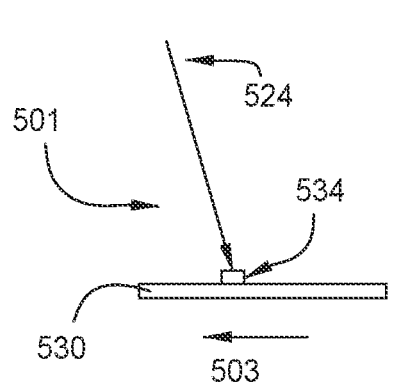
FIG. 5A
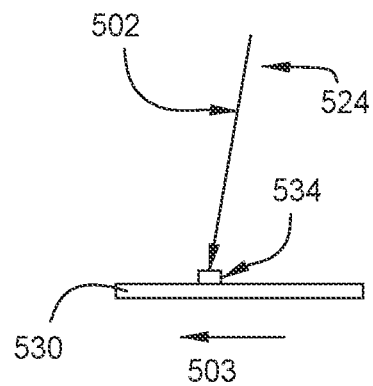
FIG. 5B
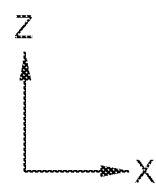

MULTIBEAMLET CHARGED PARTICLE DEVICE AND METHOD

FIELD

The present disclosure relates to a charged particle device and method of operation thereof, and particularly to devices utilizing multiple beamlets of charged particles. Embodiments described herein can be used for lithography in the semiconductor\r industry, such as direct-write lithography of semiconductor substrates using multiple electron beamlets.

BACKGROUND

Charged particle devices can be used in the semiconductor industry for lithography and inspection of integrated circuits, for example. Fabrication and inspection of semiconductor devices is aided by scaled-up operations done in serial and/or parallel. More efficient inspection and fabrication methods are continually sought to increase throughput, efficiency, and reduce fabrication errors. Multiple charged particle beamlets can be used to take advantage of parallel processing, although there remain many challenges. For example, it can be difficult to maintain adequate current density or charged particle dosage at the target when charged particle beams are split into multiple beamlets. Throughput can be increased by utilizing more beamlets, but, for a given charged particle source(s), generating more beamlets means providing less current to each beamlet. Maintaining adequately high current is therefore another problem. On the other hand, too high of current can also be a problem, because high levels of charged particle dosing can lead to undesirable sample heating. For beamlets which share optical elements in the charged particle device, there can be undesirable cross-talk between beamlets, particularly if beamlets are close in space, or in some cases even pass through the same spot.

Despite the numerous challenges, electron beams in particular are attractive for lithography and device inspection, due partly to their desirably high resolution capabilities.

Writing nanoscale features using beamlets is possible, although there can be difficulties in scaling up the process for high overall throughput, particularly when writing complex patterns (such as integrated circuits) which may require time consuming beam scanning to write desired features. For direct-write and other technologies, charged particle dosages must also be sufficient to induce physical and/or chemical changes in the target. Ensuring even and consistent dosage of charged particles at desired locations on the sample leads to challenges, particularly when seeking to simultaneously increase throughput by using a highly parallel process utilizing multiple beamlets operating at intensities just adequate to induce reproducible desired effects on the target.

SUMMARY

Herein is disclosed a method of operating a multibeamlet charged particle device, such as for lithography, including direct-write lithography of semiconductor targets. The method comprises forming a plurality of beamlets of charged particles, and directing each of the plurality of beamlets toward a blanking circuit. A target attached to a stage is translated in a translation direction. Each step of selecting beamlets, initializing beamlets, and exposing the target are repeated; each step can be performed during continuous translation of the target. The translation can be continuous at a constant velocity.

The step of selecting beamlets includes passing a reconfigurable plurality of selected beamlets through the blanking circuit. The step of initializing beamlets includes pointing each of the selected beamlets in an initial direction. The step of exposing the target includes scanning each of the selected beamlets from the initial direction to a final direction, and irradiating a plurality of regions of the target on the stage with the selected beamlets.

Herein is disclosed, in another embodiment, a method of operating a multibeamlet charged particle device, which can be a direct-write lithography method on a semiconductor target. The method comprises forming a plurality of charged particle beams, including a first beam; and forming a plurality of beamlets from each charged particle beam, including a first group of beamlets formed from the first beam. While translating a stage in a translation direction during a first exposure duration, a first subgroup of the first group of beamlets is scanned in the translation direction, and a plurality of first regions of a target on the stage is irradiated with the first subgroup of beamlets.

In some embodiments, the methods described herein may be embodied in a computer readable medium. The computer readable medium has instructions stored thereon that, when executed, cause a charged particle beam microscope to perform a method of operating a charged particle device in accordance with any of the methods described herein. In some embodiments, a controller is utilized to implement the methods. The controller can include or refer to the computer readable medium to control the operation of the charged particle device.

Herein is disclosed a multibeamlet charged particle device, comprising: a movable stage for translating a target in a translation direction; a charged particle source; a plurality of apertures configured to pass a plurality of beamlets of charged particles; and a blanking circuit which includes a plurality of elements which are reconfigurable. Each element can have a passing-state and a blocking-state. The blanking circuit can be configured to pass a reconfigurable plurality of selected beamlets of the plurality of beamlets of charged particles. The device can also include a scanner operable such that each of the plurality of selected beamlets is scanned parallel to the translation direction; and a projection lens configured to project the plurality of selected beamlets onto the target.

In an embodiment, the multibeamlet charged particle device can include a controller configured to direct each step of selecting beamlets, initializing beamlets, and exposing the target. The controller can be configured, in the step of initializing beamlets, to communicate to the scanner to point the beamlets in an initial direction. In the step of selecting beamlets, the controller is configured to communicate to each element of the blanking circuit to be in a passing-state or a blocking-state such that the plurality of selected beamlets are passed and the remainder of the plurality of beamlets are blocked. The controller can be configured, in the step of exposing the target, to communicate to the scanner to scan the plurality of selected beamlets in the translation direction, from the initial direction to a final direction; and before each step of exposing the target, to initialize beamlets and to configure the blanking circuit. The controller can be configured to synchronize the scanner and stage such that in the step of exposing the target, a plurality of focal spots of the plurality of selected beamlets on the target are stationary relative to the target. The plurality of apertures can be configured to pass the plurality of beamlets, the apertures arranged in rows and/or columns, each row and/or column being nonparallel to the translation direction, each aperture configured to pass a respective beamlet of the plurality of beamlets toward the blanking circuit.

BRIEF DESCRIPTION OF THE DRAWINGS

A full and enabling disclosure to one of ordinary skill in the art is set forth more particularly in the remainder of the specification including reference to the accompanying drawings wherein:

FIG. 1 shows a charged particle beam device, according to embodiments described herein.

FIG. 2 shows a schematic of a blanking circuit, according to embodiments described herein.

FIG. 3 illustrates the scanning of a beamlet and/or a selected beamlet, according to an embodiment.

FIG. 4A illustrates a general schematic of a method of operating a multibeamlet charged particle device, according to an embodiment.

FIG. 4B illustrates a general schematic of repeated substeps, according to an embodiment.

FIG. 5A illustrates the irradiation of a region of the target, according to an embodiment.

FIG. 5B illustrates the irradiation of a region of the target, according to an embodiment.

DETAILED DESCRIPTION

Figure 6:
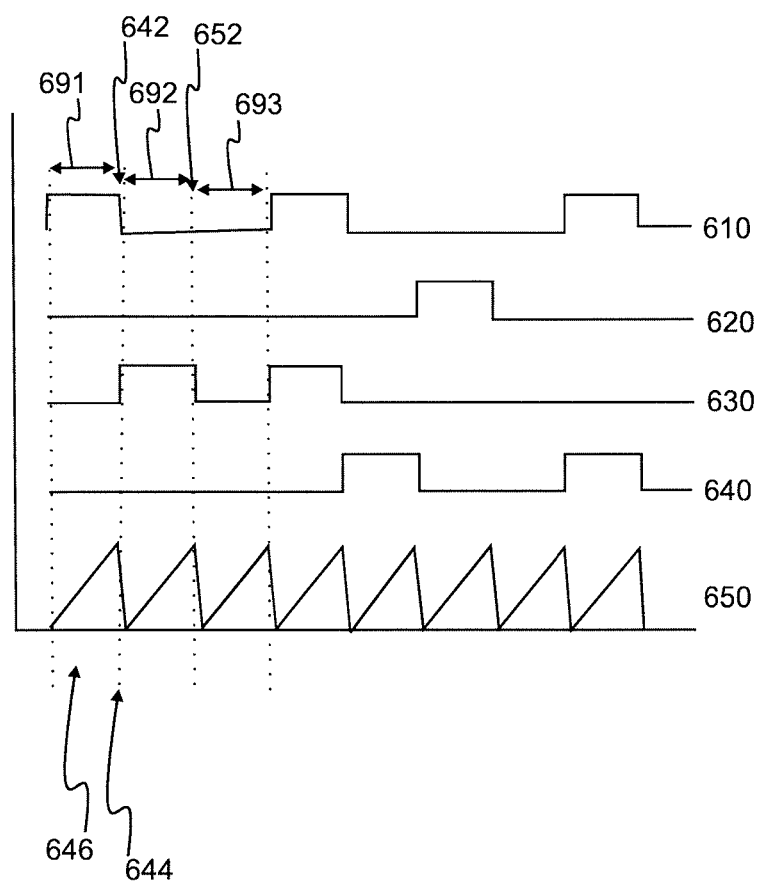
FIG. 6 illustrates schematically the operation of a multibeamlet charged particle device, according to an embodiment.

Reference will now be made in detail to the various exemplary embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. The intention is that the present disclosure includes such modifications and variations.

Within the following description of the drawings, the same reference numbers refer to the same components. Differences with respect to individual embodiments may be described, the various embodiments otherwise sharing similar or identical features. The structures shown in the drawings are not necessarily to scale.

Herein, the methods and devices are described mainly in relation to lithography, particularly direct-write lithography, but the device and operational methods described herein may also be utilized for other purposes such as sample inspection.

Herein, the term "target" may be a substrate such as a semiconductor substrate that may be patterned by the charged particle beamlets to form a semiconductor device such as an integrated circuit. For example, the target is a semiconductor material on which there are a plurality of regions which are irradiated with and/or exposed to beamlets of charged particles. Exposure of the target may be such as to write features directly on a semiconductor material target. Herein, a plurality of regions intended for irradiation by charged particle beamlets may be located on the target.

Herein, the charged particles of the multibeamlet device may be electrons. The charged particle beam source may be an electron beam source, and can include a TFE emitter.

Herein, the term "multibeamlet charged particle device" is used interchangeably with "charged particle device," "multibeamlet device," and "device." The charged particle device may be a lithography device.

Herein, the terms "beamlets" and "selected beamlets" are used. Beamlets and/or selected beamlets may be referred to as (selected) beamlets. In some contexts described herein, the term "beamlet" refers to a "selected beamlet," such as a beamlet that has passed through a blanking circuit.

Herein, the charged particle beam device described possibly includes components for the detection of secondary or backscattered particles, e.g. electrons. Embodiments can also possibly include components detecting corpuscles in the form of electrons or ions, photons, X-rays or other signals in order to obtain a specimen image. When referring to corpuscles, the corpuscles are to be understood as light signals in which the corpuscles are photons as well as particles, in which the corpuscles are ions, atoms, electrons or other particles.

Herein the terms "movable stage" and "moving stage" are used interchangeably. The movable stage may be a translation stage which translates a target in exactly one direction during operation of the multibeamlet device, possibly at constant velocity. Herein, the controller may be a computing device. The controller may optionally be triggered by signals from other components of the charged particle device. The controller may operate to synchronize the operation of other components of the charged particle device. Alternatively/additionally, the controller may send communication signals to control and/or modify the operation of other components of the charged particle device.

Herein, although other charged particle landing energies are possible, a relatively low landing energy of about 5 keV is contemplated, which can reduce undesirable heating of the target.

As described herein, discussions and descriptions relating to charged particle beams and beamlets may be exemplarily described with respect to electrons. Other types of charged particles, e.g. positive ions, could be utilized by the device in a variety of different instruments.

Herein, the terms "corresponding" and "respective" may be used interchangeably, particularly when referring to relationships between beamlets or members of pluralities of beamlets and associated components of the device(s) and related steps of the method(s) disclosed herein. For example, a beamlet may pass through a corresponding and/or respective aperture of a multiaperture plate. The beamlet may pass through or be blocked by a corresponding and/or respective element of a blanking circuit, for example. The beamlet may irradiate a corresponding region of the target, for example. The beamlet may be referred to as a selected beamlet after it passes an element of the blanking circuit.

FIG. 1 illustrates a charged particle beam device, according to an embodiment. In the embodiment shown in FIG. 1, the device 1 includes a charged particle source 101 for producing a charged particle beam 120. The charged particle beam 120 can be collimated by a collimator lens system 102. The collimated beam 121 can be directed to a plurality of apertures to pass a plurality of beamlets 122 of charged particles. The apertures may be distributed in a multiaperture plate 103. The system can possibly generate about 10,000 to 1,000,000 beamlets.

The device can include optical elements selected from the group consisting of: a stigmator, correction elements for chromatic and/or spherical aberrations, and alignment deflectors for aligning the primary charged particle beam and/or beamlets 122 to the optical axis 150. The distance between the lower portion or edge of the projection lens 110 and the target 130 can be about 1 mm to 3 mm.

The beamlets 122 can travel generally along the optical axis 150 of the device, which is referred to herein as the z axis. Directions perpendicular to z are designated x and y. The beamlets 122 can be directed to a blanking circuit 158, such as by a condenser lens array 104. The beamlets 122 and/or selected beamlets 124, which can be selected by the blanking circuit 158, may be scanned with a scanner 109 along the x and/or y directions.

FIG. 2 shows a schematic of a blanking circuit 258, according to embodiments described herein. The blanking circuit 258 can include a plurality of reconfigurable elements 203, each element having a passing-state and a blocking-state, each state to either pass or block a respective beamlet 122. For example, a first beamlet is passed by a first element 201 in a passing state, and a second beamlet is blocked by a second element 202 in a blocking state. The blanking circuit 258 can be configured to pass a reconfigurable plurality of selected beamlets 124 of the plurality of beamlets 122 of charged particles, as seen in FIG. 1.

The passing-elements and blocking-elements can be set by a controller 190, as seen in FIG. 1. The blanking circuit 158 can include a blanker array 105 and a stop array 108. The blanker array may be reconfigurable, and may pass a reconfigurable plurality of selected beamlets through the stop array 108. The blocking-elements may each block a corresponding beamlet. The passing-elements may each pass a corresponding beamlet, which may be then designated herein as being a selected beamlet. The selected beamlets may each eventually be focused onto respective regions of the target.

Referring again to FIG. 2, an element 201 of the blanking circuit 158 which is in a passing state passes a beamlet through the blanking circuit, such as by directing a selected beamlet through a respective aperture of the stop array 108. The element 201, reconfigured to be in a blocking-state (not shown), can stop the beamlet, such as by directing the unselected beamlet away from the respective aperture of the stop array 108. A plurality of elements 203, each being reconfigurable, can pass a reconfigurable plurality 124 of selected beamlets of the plurality of beamlets 122.

As shown in FIG. 1, the device 100 can include a scanner 109 which can scan the beamlets 122 and/or selected beamlets 124. The beamlets can be deflected by the scanner 109 in the x-direction and/or y-direction (e.g. perpendicular to z). The scanner 109 can be dynamically controlled by the controller 190, such as to oscillate the beamlets' direction and/or synchronize the beamlets' direction (such as to have each beamlet being directed in the same variable direction). As shown in FIG. 1, the scanner 109 is downstream of the blanking circuit 158. The scanner 109 may operate only on the selected beamlets 124 that pass through the blanking circuit 158. Alternatively/additionally, the beamlets may be scanned by a scanner and/or deflector located upstream of the blanking circuit.

The scanner 109 is operable such that each of the plurality of selected beamlets can be scanned parallel to the translation direction of the target 130 which is translated by a movable stage 132. The movable stage 132 can be operated to translate the target in the x-direction, which may along the same direction as the scanning direction of the scanner. Additionally, the movable stage 132 may be capable of moving the target in multiple directions, such as x, y, and z. The stage 132 may also be capable of rotating the target.

The device 100 can also include a projection lens 110 which can be an objective lens and/or array of lenses. The projection lens 110 can project the plurality of selected beamlets 124 onto the target 130.

The controller 190 of the device 100 can include a computer. The controller 190 may direct the operation of the device 100, such as by communicating with components. For example, the controller 190 can communicate with the scanner 109, blanking circuit 158, and/or movable stage 132. The controller 190 can synchronize components of the device 100, such as synchronize the movement of the scanner 109 and stage 132, such as to have the scanner 109 and stage 132 operate a "beam staring" process.

In an embodiment, the controller 190 can communicate to each element 203 of the blanking circuit 158 to be in a passing-state or blocking-state.

The controller 190 can communicate to the scanner 109 to steer the beamlets 122 and/or the selected beamlets 124, such as to point the (selected) beamlets 122, 124 in an initial direction, and to scan them from the initial direction to a final direction. For example, the controller 190 communicates to the scanner to scan selected beamlets which have passed though the blanking circuit. The initial beamlet direction and the final beamlet direction can define a scan range.

FIG. 3 illustrates the scanning of a beamlet and/or a selected beamlet, according to an embodiment. The beamlet starts at an initial direction 301 and is scanned in a scanning direction 303 to a final direction 302. The scanning direction 303 may be parallel to the translation direction of the movable stage 132.

In an embodiment, the (selected) beamlets 122, 124 are scanned in a scanning direction 303 which is parallel to the translation direction of the movable stage 132. By scanning the (selected) beamlets 122, 124 and stage in the same direction, the exposure duration of regions of the target to the charged particles of respective beamlets can be increased. This may aid, for example, in reaching a predetermined dose of charged particles, which may be such as to generate a desired feature (e.g. a via, cut, trench) on the target.

In an embodiment that may be combined with any other embodiment, the scanning velocity of the (selected) beamlets 122, 124 at the target 130 and the translation velocity of the target 130 are the same. Each selected beamlet 124 may irradiate a respective region of the target 130, simultaneously and constantly, during simultaneous scanning of beamlets 124 and translation of the target 130. Such a "beam staring" embodiment can be combined with any other embodiment described herein. The translation velocity of the target 130 can be determined by the translation velocity of the movable stage 132.

According to an embodiment, while the target 130 is exposed to the selected beamlets, the (selected) beamlets 122, 124 can be scanned continually in the translation direction of the movable stage 132. The scanning can be done by the scanner 109. The beamlets 124 can pass through the projection lens array 110 and be projected onto target 130. Selected beamlets 124 irradiate a plurality of regions of the target 130, which may be on the moveable stage 132. For lithography applications, the target 130 can be a wafer provided with a charged-particle sensitive layer or resist layer.

FIG. 4A illustrates a general schematic of a method 400 of operating a multibeamlet charged particle device, according to an embodiment. A plurality of beamlets is formed 410, and each of the beamlets are directed toward a blanking circuit 420. The target is translated in a translation direction 430. The following sub-steps are repeated 440: selecting beamlets 442, initializing beamlets 444, and exposing the target 446.

FIG. 4B illustrates a general schematic of the repeated sub-steps 440, according to an embodiment.

According to an embodiment, the target is translated in a translation direction 430, and the translation is continuous (and can be at a constant translation velocity) as the sub-steps are repeated 440, including the step of exposing the target 446. The step of exposing the target 446 includes irradiating a plurality of regions of the target 130 with selected beamlets 124; and scanning each of the selected beamlets 124 from the initial direction 301 to the final direction 302 (see also FIG. 3). In other words, in the step of exposing the target 446, the selected beamlets 124 can be scanned along a scanning direction 303 which can be parallel to the translation direction of the movable stage 132. Exposing the target 446 may be in the form of "beam staring;" exposing the target 446 may include each selected beamlet 124 irradiating a respective region of the target 130, simultaneously and constantly, during simultaneous scanning of beamlets 124 and translation of the target 130.

In an embodiment, the translation velocity of the movable stage and the scanning velocity of the beamlets are the same. The scanning of beamlets and the translating of the movable stage can be synchronized and aligned such that each focal spot of each selected beamlet 124 is stationary relative to the target 130 while each respective region of the target is irradiated.

FIGS. 5A and 5B illustrate the irradiation of a region of the target, according to an embodiment described herein. Exposing the target can include irradiating a region 534 of the target 530 with a selected beamlet 524. The selected beamlet 524 is scanned in the same direction as the translation direction 503 of the target 530. The frames depicted in FIGS. 5A and 5B illustrate progression of the movement of the target 530 and progression of the scanning of the selected beamlet 524 from the initial direction 501 to the final direction 502. The translation of the target 530 can be continuous and/or constant, e.g. at a constant velocity. The translation velocity of the target 530, during the step of exposing the target 446 can match the scanning velocity of each of the selected beamlets 524 at the target 530.

The selected beamlet 524 may be one of a plurality of selected beamlets (a plurality of beamlets is not shown in FIGS. 5A and 5B, for clarity); and the region 534 may be one of a plurality of regions 533. In other words, during the step of exposing the target 446: a plurality of regions 533 can be irradiated with a plurality of selected beamlets. Each of the selected beamlets 124 is scanned from the initial direction 501 to the final direction 502, and this can be such that each selected beamlet 124 is stationary relative to the target 130 while each region 533 of the target 530 is irradiated.

FIG. 6 illustrates schematically the operation of a multibeamlet charged particle device, according to an embodiment. A scanning voltage 650 which can be applied to the scanner 190 is depicted. The scanner 190 may receive the scanning voltage 650 which may be determined by the controller 190. The voltage 650 can induce scanning of the (selected) beamlets 124. In an embodiment, all the selected beamlets 124 pass through the scanner 190 and are scanned.

As seen in FIG. 6, the scanning voltage 650 can be ramped during the step of exposing the target 646, which can correspond to the (continuous) scanning of (selected) beamlets. During the step of initializing beamlets 644, the voltage 650 to the deflector may be ramped down. The step of exposing the target 646 can include ramping the scanning voltage 650 to the scanner 109 (which may be a deflector) such that each of the selected beamlets are continuously scanned, as illustrated by the scanning voltage 650 during each of the durations 691, 692, 693 . . . . After the step of exposing the target 646, the step of initializing beamlets 644 can be performed, which can include ramping-down the scanning voltage 650 to the scanner 109 such that each of the selected beamlets return to the initial direction, as illustrated by the scanning voltage 650 during the initializing of beamlets 644. As depicted in FIG. 6, after exposing the target 646 (during a first duration 691) and initializing beamlets 644, there can be a repeated step of exposing the target (during a second duration 692).

In the example shown in FIG. 6, the first duration 691 includes ramping of the scanning voltage 650 which corresponds to scanning of the selected beamlet from an initial direction 301 to a final direction 302. A region 534 of the target 130 is exposed by the selected beamlet 524 which corresponds to an element of the blanking circuit 158 receiving selection signal 610.

In the example shown in FIG. 6, the second duration 692 which follows the first duration 691 includes ramping of the scanning voltage 650 which corresponds to scanning of another selected beamlet from an initial direction 301 to a final direction 302. Another region of the target 130 is exposed by the selected beamlet which corresponds to an element of the blanking circuit 158 receiving selection signal 630.

It is possible, during a duration (such as the third duration 693), that none of the beamlets are selected. It is also possible, during a duration, that more than one beamlet is selected.

Selection signals 610, 620, 630, 640 of FIG. 6 illustrate operation of the method, particularly relating to the step of selection of beamlets 442, according to an embodiment. Selection signals 610, 620, 630, 640 can each be controlled by the controller 190, which can communicate the selection signals 610, 620, 630, 640 to elements 203 of the blanking circuit 158. During a step of selecting beamlets 642, a reconfigurable plurality of selected beamlets 124 can be passed through the blanking circuit 158. In FIG. 6, two steps of selecting beamlets 642, 652 are referenced; and more are apparent in the figure (refer also to FIGS. 4A and 4B indicating that the step of selecting beamlets 442 is repeated). Beamlets can be selected before/after scanning selected beamlets (e.g. while exposing the target 446).

The step of selecting beamlets 642 can also include at least one of the following: setting each element of the blanking circuit 158, and blocking each of a reconfigurable plurality of unselected beamlets with a plurality of corresponding blocking-elements. Each of the selected beamlets 124 can be passed by a respective passing-element 201 of a reconfigurable plurality of passing elements. Selecting beamlets 642 can also include setting each element 203 of the blanking circuit 158 to form a reconfigurable passing-subset and a reconfigurable blocking-subset of the elements. Each passing-element 201 of the passing-subset can pass a selected beamlet of the plurality of selected beamlets. Each blocking-element 202 of the blocking-subset can block an unselected beamlet.

FIG. 6 also illustrates iterations of the steps of selecting beamlets 642, exposing targets 646, and initializing beamlets 644. In FIG. 6, the horizontal axis is time.

The leftmost point of the scanning voltage 650 (where the scanning voltage is at the first minimum), can correspond to the beamlets being at an initial direction. The scanning voltage 650 can communicate to the scanner to scan such that each of the (selected) beamlets are scanned. In the illustrative example of FIG. 6, a first beamlet is selected by a first element, as seen in the first selection signal 610, for a first duration 691. The first beamlet is blocked for the second and third durations 692, 693, and is again selected at the fourth duration . . . . As apparent from FIG. 6, the ramped scanning voltage 650 can be repeated at each iteration of successive durations 691, 692, 693 . . . during which reconfigurably selected beamlets expose corresponding regions of the target 130.

Selection signals 610, 620, 630, 640 . . . can be communication signals (e.g. ON/OFF signals) between the controller 190 and elements 203 of the blanking circuit 158. The selection signals 610, 620, 630, 640 . . . can be used to reconfigure the beamlets (e.g. select/unselect) and/or elements 203 of the blanking circuit 158.

In the first duration 691, in the example of FIG. 6, the second through fourth signals 620, 630, 640 communicate to respective second through fourth elements of the blanking circuit 158 to block each of a second through fourth beamlet. In the second duration 692, in the example of FIG. 6, the first, second and fourth beamlets are blocked by the respective first, second and fourth elements, due to the first, second and fourth signals 610, 620, 640. In the second duration 692, the third beamlet is passed through the third element. At each iteration of exposing the target (e.g. during successive durations 691, 692, 693 . . . ), a passing-subset and a blocking-subset of elements of the blanking circuit 158 can be configured.

Referring again to FIG. 6 for illustration, after an $M^{th}$ iteration of exposing the target (for example the first duration 691), the step of selecting beamlets 642 can reconfigure each of the passing-subset and the blocking-subset of elements of the blanking circuit 158 before an $N^{th}$ iteration (for example the second duration 692, or the M+1 iteration) of exposing the target.

FIG. 6 shows that before and/or after each step of exposing the target 446, such as between the first duration 691 and the second duration 692, the steps of selecting beamlets 642 and initialing beamlets 644 can be performed. For example, the controller 190 reconfigures the passing-subset and blocking-subset elements of the blanking circuit between the first duration 691 and the second duration 692 of exposing the target. Alternatively/additionally, the reconfiguration can be done shortly before/after the beginning of the second duration 692. The controller can also communicate to the scanner to be configured to direct the selected beamlets in the initial direction, between the first duration 691 and the second duration 692 of exposing the target 446 (and/or shortly before/after the second duration 692).

The step of initializing beamlets (less than 10 μs, for example) can be faster than the step of exposing the target (a duration of at least 10 μs, for example). The steps of selecting beamlets and initializing beamlets can be performed (together, simultaneously, and/or jointly) after the step of exposing the target (e.g. after the Mth step of exposure and before the M+1 step). Each reconfiguration (e.g. selecting and initializing beamlets) can require an insignificant amount of time compared to each duration 691, 692 . . . during which regions are exposed.

The step of exposing the target can also include focusing each of the selected beamlets onto a plurality of focal spots on the target. Each focal spot can irradiate each corresponding region (see the region 534 of FIGS. 5A and 5B, for example) of a plurality of regions of the target. The scanning of the scanner 109 and the translating of the movable stage 132 can be synchronized and aligned such that each focal spot is stationary relative to the target 130 during the step of exposing the target. The exposing of the target 446 can be such that each of the selected beamlets is continually scanned in the translation direction. The beamlets, particularly when focused onto the regions, can generate a cut, a trench, and/or a via at each of the plurality of regions. Regions irradiated by beamlets can meet and/or overlap, such as to enable formation of larger features and/or increase dosage.

In an embodiment, the movable stage 132 can be translated at a constant velocity during repetition of the steps of exposing the target 446, initializing the beamlets 444, and selecting beamlets 442.

Figures 7A, 7B:
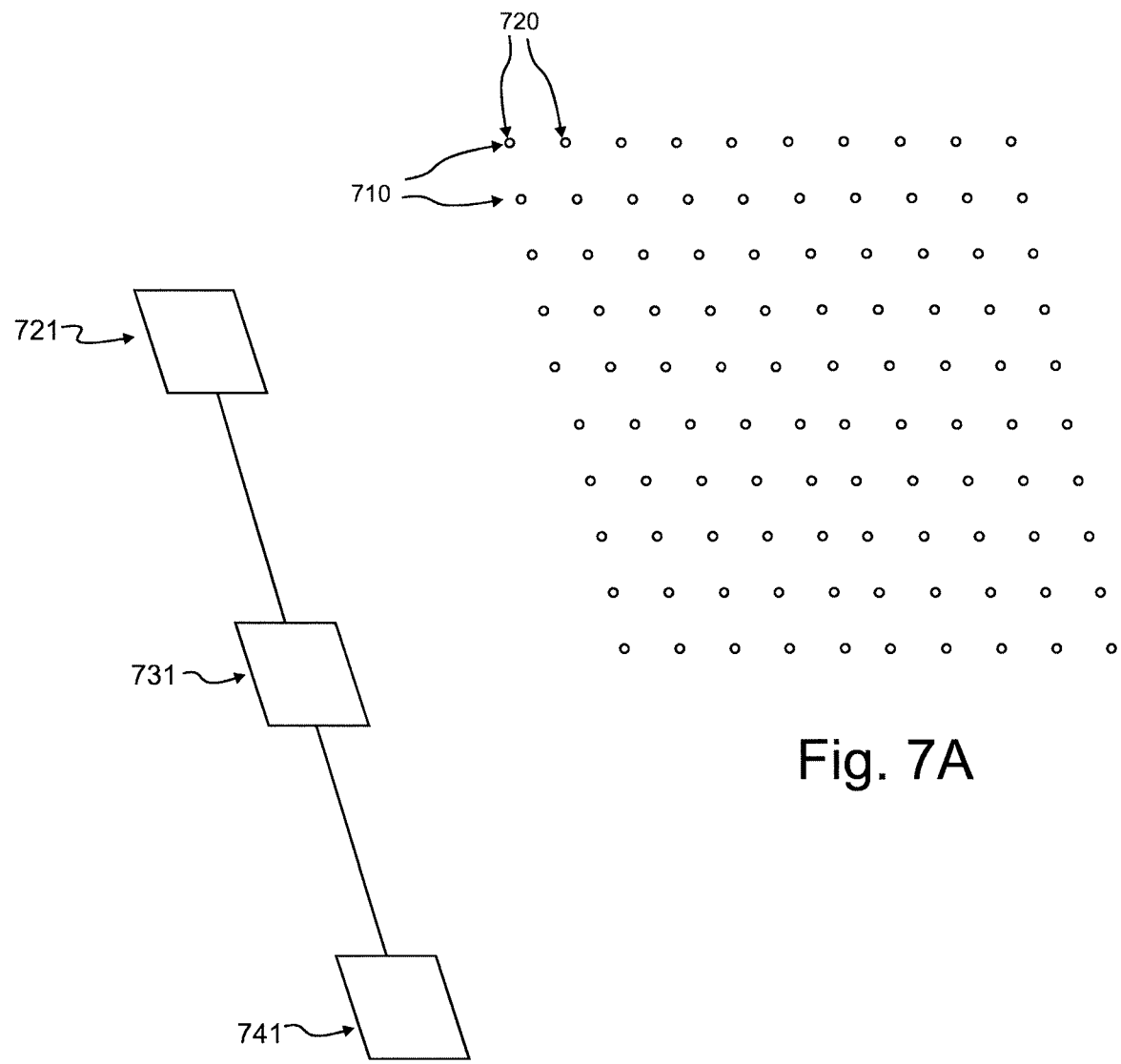
FIG. 7A illustrates, according to an embodiment, an arrangement of beamlets.
FIG. 7B illustrates, according to an embodiment, an arrangement of beamlets.

FIG. 7A illustrates, according to an embodiment, an arrangement of beamlets in a grid. The arrangement of beamlets can be determined by the arrangement of apertures on a multiaperture plate(s) 103 that generate the beamlets 122. The arrangement of beamlets can be rows 710 and columns 720, each beamlet 122 possibly being evenly spaced along the direction of the rows and evenly spaced in the direction of the columns. The rows and/or columns can be nonparallel to the translation direction, such as at a small angle with respect to the translation direction of the movable stage. The beamlets may be arranged as a parallelogram or rhombus. In an embodiment, the rows of beamlets may be perpendicular to the translation direction of the movable stage 132, and the columns may be nonparallel to the translation direction. The grid may be rectangular, such as rectangular and nonparallel and non-normal to the translation direction. Each of the rows can be parallel to each other row; each of the columns can be parallel to each other column. The rows and columns are optionally orthogonal to each other and nonparallel to the translation direction.

FIG. 7B illustrates, according to an embodiment, an arrangement of beamlets. Each group of beamlets 721, 731, 741 may be arranged in the shape of a parallelogram, rhombus, and/or rectangle. The arrangement of beamlets within each group 721, 731, 741 may be as described above and/or as depicted in FIG. 7A.

As illustrated in FIGS. 8A-8I, according to an embodiment, the translation direction 803 can be nonparallel to the rows and/or columns of the beamlets. FIG. 8 illustrates that if each beamlet is selected for projection onto the target, the surface area of a given swath of the target can be scanned completely, as the target is moved in the translation direction 803. The beamlets are arranged with respect to the translation direction 803 such that they are configured to cover the entire swath of the target, if each of the beamlets are selected to pass through the blanking circuit 158.

The device 1 can be configured such that if all the beamlets are selected to pass through the blocking circuit 158, a continuous swath of the target 130 can be irradiated. In practice, the focal spot sizes of beamlets on the target may vary. The (i) ranges scanned by the scanning of beamlets, e.g. during steps of exposing the target 446, the (ii) focal spot size of the beamlets, and/or (iii) the arrangement of beamlets can be such that regions 534 irradiated by two or more beamlets can meet and/or overlap.

Figure 8A:
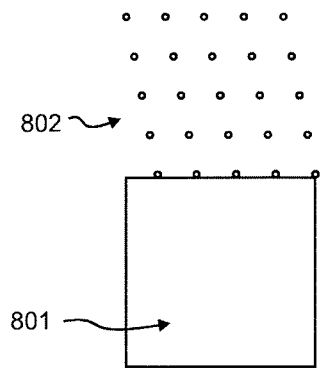
FIGS. 8A-8I illustrate, according to an embodiment, the translation direction and beamlets.
Figure 8B:
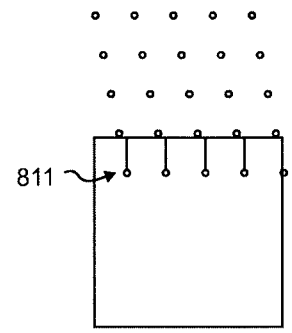
Figure 8C:
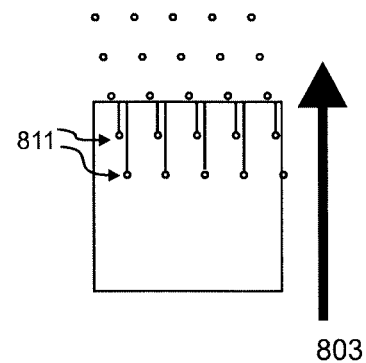
Figure 8D:
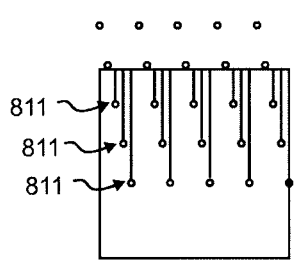
Figure 8E:
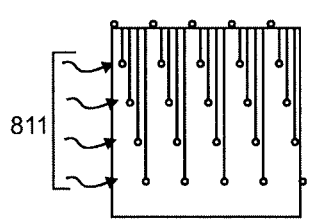
Figure 8F:
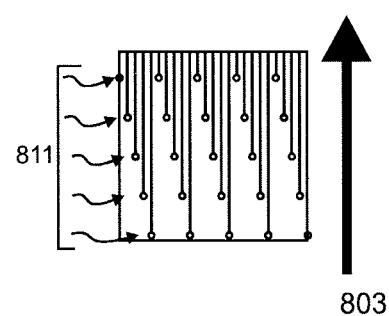
Figure 8G:
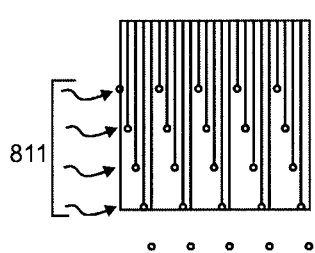
Figure 8H:
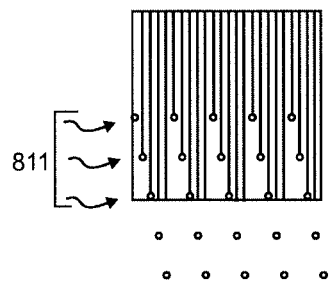

In FIG. 8A, an area 801 of the target is indicated, which is also shown in FIGS. 8B-8I. A group 802 of beamlets is also shown in FIGS. 8A-8I, as indicated in FIG. 8A. The translation direction 803 is constant, as indicated in FIGS. 8A-8I. The target can be translated at a constant velocity, particularly during the repeated sub-steps 440. Rows of beamlets which irradiate the area 801 of the target, as the area 801 is translated in the translation direction 803, are indicated with reference numeral 811 (FIGS. 8A-8I), which are referred to as "ON" beamlets. "ON" beamlets can be selected beamlets which are irradiating a region within the area 801 of the target.

Figure 8I:
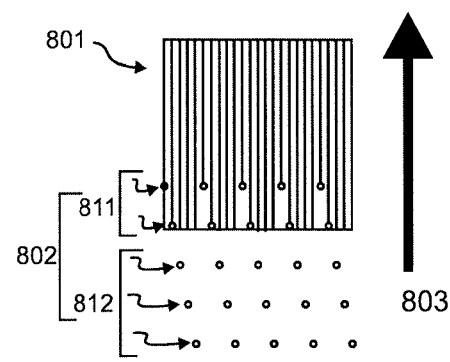

FIG. 8I shows the group 802 of beamlets which includes "ON" beamlets 811 that are irradiating the area 801 of the target and beamlets "OFF" beamlets 812 labeled in FIG. 8I irradiated regions of the area 801 previously (FIGS. 8B-8H).

The beamlets can be spaced apart by 20 to 30 nm. The distance between any two adjacent rows/columns may be about 20 to 30 nm.

Figure 9:
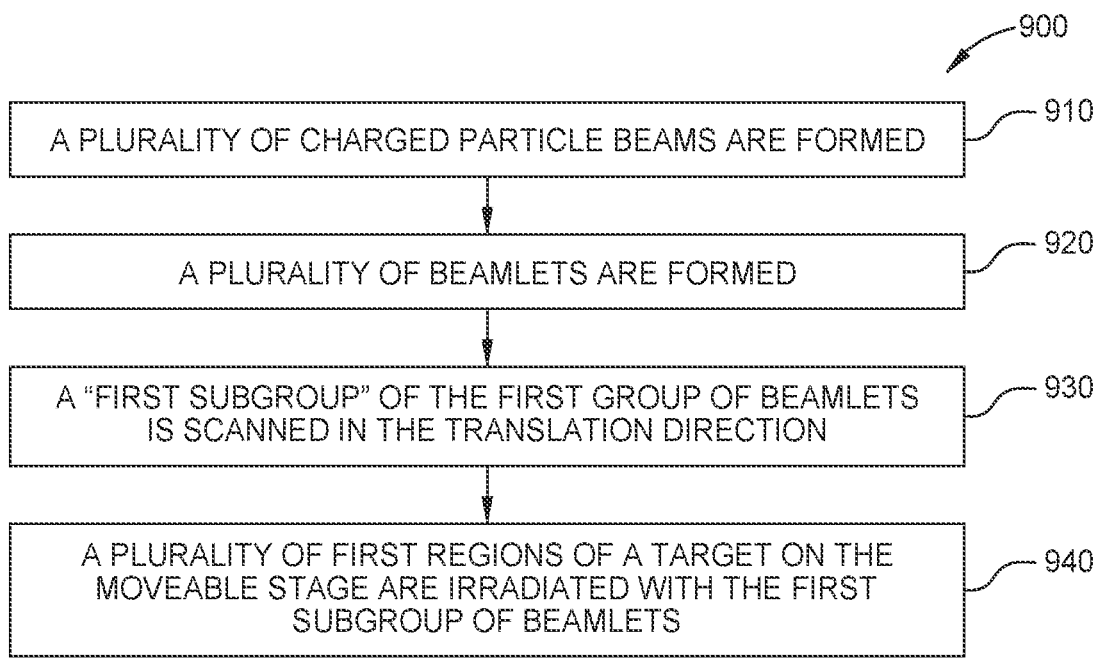
FIG. 9 illustrates, according to an embodiment, a method of operating a multibeamlet charged particle device.

The arrangement of the beamlets may provide redundancy. The plurality of beamlets and/or beamlet-forming apertures may be such that any given area of the sample which is intended to be irradiated can be reached by more than one beamlet (e.g. can be irradiated by more than one beamlet). Redundancy may reduce errors in the end irradiation pattern. For example, if there are dead beamlets, the regions intended to be irradiated by dead beamlets may be irradiated by another beamlet. Alternatively/additionally, a region of the target which is intended to be irradiated may be irradiated by more than one beamlet in order to reach a desired dosage which might not be reachable by irradiation with one beamlet FIG. 9 illustrates, according to an embodiment, a method of operating a multibeamlet charged particle device. A plurality of charged particle beams are formed 910, including a first beam. A plurality of beamlets are formed 920 from each beam, including a "first group" of beamlets formed from the "first beam." While translating a movable stage 132 in a translation direction during a first exposure duration, a "first subgroup" of the first group of beamlets, which can be passed through and/or selected by the blanking circuit 158, is scanned in the translation direction 930; and a plurality of first regions of a target on the movable stage are irradiated with the first subgroup of beamlets 940.

The method of operating the device may include serial and parallel exposures of the target 130 by subgroups of beamlets. For example, there is a first exposure duration, a second exposure duration, a third . . . . Each exposure duration (see 691, 692 . . . of FIG. 6, for example) may be the same length of time. At the beginning of the first exposure duration (and/or each exposure duration), each beamlet of the first subgroup of beamlets (and/or each beamlet) can point in an initial beamlet direction. At the end of the first exposure duration, each beamlet of the first subgroup of beamlets (and/or each beamlet) can point in a final beamlet direction. At the end of each exposure duration each selected beamlet and/or each subgroup of beamlets which pass through the blanking circuit can point in the final beamlet direction, ready to be reinitialized and/or the subgroup reconfigured.

A plurality of regions of the target can be irradiated with subgroups of beamlets. During each exposure duration, regions of the target can be irradiated.

For example, in addition to the first group of beamlets (as described above), a second group of beamlets can be formed from a second beam. A "second subgroup" of the second group of beamlets, which can be passed through and/or selected by the blanking device, can be scanned in the translation direction; and a plurality of second regions of the target can be irradiated with the second subgroup. During the first exposure duration, a plurality of second regions of the target can be irradiated with the second subgroup of beamlets. At the beginning of the first exposure duration, each beamlet of the second subgroup of beamlets can point in the initial beamlet direction. At the end of the first exposure duration, each beamlet of the second subgroup of beamlets can point in the final beamlet direction.

The remainder of beamlets of the first group which do not form the first subgroup (and the remainder of beamlets of the second group which do not form the second subgroup) can be blocked, such as by the blanking circuit 158.

As suggested by FIG. 1, the scanner 109 can be downstream of the beam blanker 158. The scanner 109 can operate on a variable configuration of selected beamlets 124. The scanning signal 650 (see FIG. 6) may be repeated to so that each configuration of selected beamlet(s) is scanned from the initial direction 301 to the final direction 302. The configuration of selected beamlets 124 can be changed, at the end and/or beginning of each duration of scanning. Each duration of scanning may correspond to a respective duration of exposing region(s) of the target by the configuration of selected beamlets. An overall pattern of exposure of the target 130 to the charged particles can be generated.

A "beam staring" portion of the operation of the charged particle device 1 may be repeated during each exposure duration (see 691, 692, 693 of FIG. 6), and the initialization and/or reconfiguration of the beamlets may occur in a duration of time that is insignificant compared to the exposure durations. The "beam staring" may be enabled by synchronizing (e.g. matching) the velocity of the translation of the target by the stage 132 to the beamlet scanning.

During each exposure duration (see 691, 692, 693 of FIG. 6): at the beginning of the exposure duration, the (selected) beamlets can point in the initial direction; at the end of the exposure duration, the (selected) beamlets can point in the final direction. During each exposure duration, the (selected) beamlets are scanned in the same direction as the translation direction of the movable stage.

The velocity of the stage can be the same as the velocity of the focal spots of the (selected) beamlets on the target.

In an embodiment, as the target moves at the translation velocity, the selected beamlets each irradiate continuously a corresponding region of the target. The selected beamlets can be scanned such that each beamlet "stares at" a corresponding region of the target. Each of the plurality of regions exposed to a selected beamlet can receive a predetermined dose of charged particles. Each predetermined dose received by each region can be met within each exposure duration. The predetermined dose can be the time integral of the current of the selected beamlet over the exposure duration; and the exposure duration can be the time that the stage travels as the selected beamlets are scanned from the initial direction to the final direction.

In an embodiment, each of the beamlets has a substantially constant intensity at the target. The beamlets intensities can be constant. The irradiated pattern on the target can be varied due to the selection of various beamlets and/or subsets of beamlets by the controller/blanking circuit.

Figure 10:
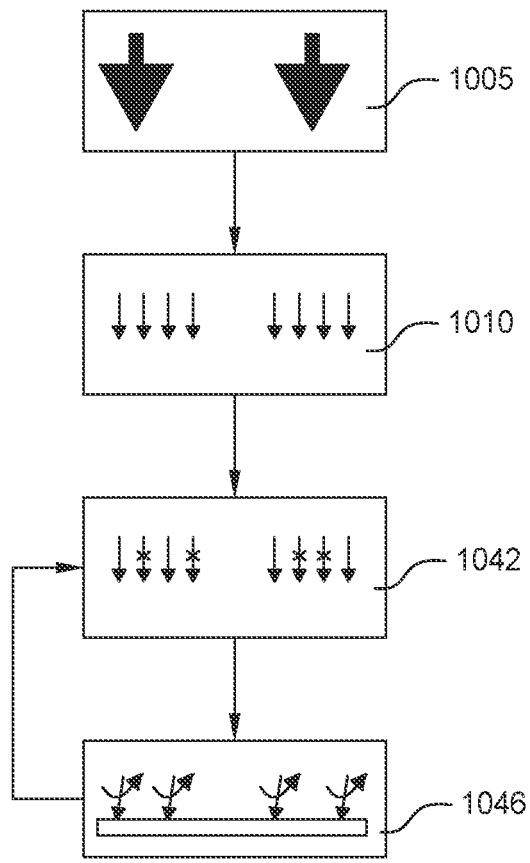
FIG. 10 illustrates, according to an embodiment, a method of operating a multibeamlet charged particle device.

FIG. 10 illustrates, according to an embodiment, a method of operating a multibeamlet charged particle device. Beams are formed 1005, including first and second beams. Each beam forms a plurality of beamlets 1010, which are selected/ unselected 1042 and scanned 1046 as regions of the target are exposed. Analogously to the methods illustrated in FIGS. 4A and 4B, the steps of selecting and scanning beamlets 1042, 1046 can be repeated. Selecting beamlets 1042 may be done by reconfiguring the blanking circuit 158, and/or passing signals 610, 620 . . . from the controller 190 to elements 203 of the blanking circuit 158, etc. as described above. Scanning the beamlets 1046 may include initializing beamlets 444 and may be performed while exposing the target 446 and/or translating the movable stage.

The selection of beamlets 1042 can form subgroups, e.g. a first subgroup of the first group of beamlets formed from the first beam, and a second subgroup of the second group of beamlets formed from the second beam, such as described hereinabove. The subgroups, which can be reconfigurable pluralities of selected beamlets, such as described herein, may irradiate regions of the target. Variations and optional features as described hereinabove may also be applied to the embodiment depicted in FIG. 10, e.g. to operation of the device 1.

Embodiments disclosed herein are susceptible to modifications and alternative forms. Features, particularly optional features, described above in various embodiments are expressly intended to be combined with other embodiments to lead to yet further embodiments. Although specific embodiments have been described, the embodiments are not intended to strictly limit the invention, which is defined in the claims. While the foregoing is directed to embodiments of the invention, other and further embodiments of the invention may be devised without departing from the basic scope thereof, and the scope is to be determined by the claims that follow.

What is claimed is:

1. A method of operating a multibeamlet charged particle device, comprising:
    forming a plurality of beamlets of charged particles;
    directing each of the plurality of beamlets toward a blanking circuit;
    translating a target attached to a movable stage in a translation direction; and
    repeating each step of selecting beamlets, initializing beamlets, and exposing the target;
    wherein the step of selecting beamlets includes
        setting each element of the blanking circuit, each element being reconfigurable, to be a passing-element or a blocking-element to form a reconfigurable passing-subset and a reconfigurable blocking subset of the elements;
        passing each of a reconfigurable plurality of selected beamlets through the blanking circuit by a respective passing-element; and blocking each of a reconfigurable plurality of unselected beamlets by a respective blocking-element of the blocking-subset; and wherein
    the step of initializing beamlets includes pointing each of the selected beamlets in an initial direction; and wherein
    the step of exposing the target includes:
        scanning each of the selected beamlets from the initial direction to a final direction, and
        irradiating a plurality of regions of the target on the movable stage with the selected beamlets,
        wherein after an $M^{th}$ iteration of exposing the target, the step of selecting beamlets reconfigures each of the passing-subset and the blocking-subset before an $N^{th}$ iteration of exposing the target.

2. The method of claim 1, wherein the target is a semiconductor material on which the plurality of regions is located,
    the exposing the target is writing features directly on the semiconductor material, and
    wherein the charged particles are electrons.

3. The method of claim 1, wherein the plurality of regions are exposed to a predetermined dose of charged particles, and
    the predetermined dose is met within an exposure duration;
    wherein the predetermined dose is sufficient to generate a desired feature such as a via, cut, or trench on the target.

4. The method of claim 1, wherein each of a plurality of corresponding regions of the plurality of regions is irradiated with a corresponding selected beamlets which passes through a corresponding passing-element of the blanking circuit during the $M^{th}$ iteration of the step of exposing the target.

5. The method of claim 1, wherein after the step of exposing the target, the steps of selecting beamlets and initializing beamlets are performed; and
    wherein initializing beamlets is faster than exposing the target, and wherein each exposing the target occurs during an exposure duration of at least 10 µs.

6. The method of claim 1, wherein the exposing the target further comprises:
    focusing each of the selected beamlets onto a plurality of focal spots on the target, each focal spot irradiating a corresponding region of the plurality of regions; and
    wherein the scanning and the translating of the movable stage are synchronized and aligned such that each focal spot is stationary relative to the target.

7. The method of claim 1, wherein the exposing the target is such that each of the selected beamlets is continually scanned in the translation direction.

8. The method of claim 7, wherein the step of exposing the target further comprises:
    ramping a voltage to a deflector such that each of the selected beamlets are continuously scanned; and
    after the exposing the target, the step of initializing beamlets is performed, which further includes
        ramping-down the voltage to the deflector such that each of the selected beamlets return to the initial direction.

9. The method of claim 1, wherein the translating the target and the exposing the target are simultaneous.

10. The method of claim 1, wherein translating the target is performed continuously while repeating each step of selecting beamlets, initializing beamlets, and exposing the target; and wherein translating the target is at a constant velocity.

11. The method of claim 1, wherein, at the target, each selected beamlet has a substantially constant intensity.

12. The method of claim 1, further comprising generating a cut, a trench, and/or a via at each of the plurality of regions.

13. The method of claim 1, wherein the beamlets are arranged in a grid of rows and/or columns, the translation direction being nonparallel to each of the rows and/or columns.

14. A method of operating a multibeamlet charged particle device, comprising:
    forming a plurality of charged particle beams, including a first beam;
    forming a plurality of beamlets from each charged particle beam, including a first group of beamlets formed from the first beam; and while translating a movable stage in a translation direction during a first exposure duration,
setting each element of a blanking circuit, each element being reconfigurable, to form a reconfigurable passing-subset and a reconfigurable blocking-subset of the elements,
scanning a first subgroup of the first group of beamlets in the translation direction, and
irradiating a plurality of first regions of a target on the movable stage with the first subgroup of beamlets,
wherein after an $M^{th}$ iteration of irradiating the target, reconfiguring each of the passing-subset and the blocking-subset before an $N^{th}$ iteration of irradiating the target.

15. The method of claim 14, further comprising, during the first exposure duration:
blocking a remainder of beamlets of the first group that are not in the first subgroup.

16. The method of claim 15, further comprising, during the first exposure duration:
scanning a second subgroup of beamlets, formed from a second beam of the plurality of charged particle beams, in the translation direction,
irradiating a plurality of second regions of the target on the movable stage with the second subgroup of beamlets of a second group of beamlets.

17. The method of claim 14, wherein at the beginning of the first exposure duration, each beamlet of the first subgroup of beamlets points in an initial beamlet direction; and
at the end of the first exposure duration, each beamlet of the first subgroup of beamlets points in a final beamlet direction;
wherein the initial beamlet direction and the final beamlet direction define a scan range; and
at the beginning of the first exposure duration, each beamlet of the second subgroup of beamlets points in the initial beamlet direction; and
at the end of the first exposure duration, each beamlet of the second subgroup of beamlets points in the final beamlet direction.

18. A multibeamlet charged particle device, comprising:
a movable stage for translating a target in a translation direction;
a charged particle source;
a plurality of apertures configured to pass a plurality of beamlets of charged particles;
a blanking circuit which includes a plurality of elements which are reconfigurable, each element having a passing-state and a blocking-state, the blanking circuit configured to pass a reconfigurable plurality of selected beamlets of the plurality of beamlets of charged particles;
a scanner operable such that each of the plurality of selected beamlets is scanned parallel to the translation direction;
a projection lens configured to project the plurality of selected beamlets onto the target; and
a controller configured to direct each step of selecting beamlets, initializing beamlets, and exposing the target; wherein
the controller is configured
in the step of initializing beamlets, to communicate to the scanner to point the beamlets in an initial direction;
the controller further configured,
in the step of selecting beamlets, to communicate to each element of the blanking circuit to be in a passing-state or a blocking-state, such as to form a reconfigurable passing-subset and a reconfigurable blocking-subset of the elements, such that the plurality of selected beamlets are passed and the remainder of the plurality of beamlets are blocked; and,
the controller further configured,
in the step of exposing the target, to communicate to the scanner to scan the plurality of selected beamlets in the translation direction, from the initial direction to a final direction; and
before each step of exposing the target, to initialize beamlets and to configure the blanking circuit; and
the controller is further configured to synchronize the scanner and movable stage such that in the step of exposing the target, a plurality of focal spots of the plurality of selected beamlets on the target are stationary relative to the target; and wherein
the plurality of apertures is configured to pass the plurality of beamlets, the apertures arranged in rows and/or columns, each row and/or column being nonparallel to the translation direction, each aperture configured to pass a respective beamlet of the plurality of beamlets toward the blanking circuit, and wherein after an $M^{th}$ iteration of exposing the target, the step of selecting beamlets reconfigures each of the passing-subset and the blocking-subset before an $N^{th}$ iteration of exposing the target.

* * * * *